(12) United States Patent
Li et al.

(10) Patent No.: US 9,196,430 B2
(45) Date of Patent: Nov. 24, 2015

(54) ELECTRICAL CIRCUIT PROTECTION DEVICE ENCLOSURE ASSEMBLY AND KIT WITH DEVICE COMPATIBILITY ATTACHMENT

(71) Applicant: Cooper Technologies Company, Houston, TX (US)

(72) Inventors: Haimin Li, Xi'an (CN); William Giancola, Ballwin, MO (US); Piyush Saxena, Ballwin, MO (US)

(73) Assignee: COOPER TECHNOLOGIES COMPANY, Houston, TX (US)

( * ) Notice: Subject to any disclaimer, the term of this patent is extended or adjusted under 35 U.S.C. 154(b) by 29 days.

(21) Appl. No.: 13/679,195

(22) Filed: Nov. 16, 2012

(65) Prior Publication Data

US 2014/0138146 A1 May 22, 2014

(51) Int. Cl.
*H05K 5/00* (2006.01)
*H01H 9/02* (2006.01)
*H05K 5/02* (2006.01)

(52) U.S. Cl.
CPC .............. *H01H 9/02* (2013.01); *H05K 5/0008* (2013.01); *H05K 5/0013* (2013.01); *H05K 5/0252* (2013.01)

(58) Field of Classification Search
CPC .. H05K 5/0013; H05K 5/0252; H05K 5/0008
USPC ................................................... 174/560, 562
See application file for complete search history.

(56) References Cited

U.S. PATENT DOCUMENTS

| | | | | |
|---|---|---|---|---|
| 5,646,816 | A * | 7/1997 | Alden et al. | 361/622 |
| 5,693,911 | A * | 12/1997 | Sydow | 174/66 |
| 5,901,044 | A * | 5/1999 | Marro | 361/728 |
| 7,102,078 | B2 * | 9/2006 | Weber et al. | 174/50 |
| 2002/0001182 | A1 * | 1/2002 | Stark et al. | 361/752 |
| 2007/0002597 | A1 * | 1/2007 | Kajiwara et al. | 363/110 |
| 2008/0040958 | A1 * | 2/2008 | Hutchinson et al. | 40/564 |
| 2008/0101034 | A1 * | 5/2008 | Loon | 361/719 |
| 2008/0259573 | A1 * | 10/2008 | Besserer et al. | 361/724 |
| 2011/0253411 | A1 * | 10/2011 | Hum et al. | 174/50 |
| 2012/0305282 | A1 * | 12/2012 | Frazer | 174/51 |
| 2013/0125975 | A1 * | 5/2013 | Malik et al. | 136/256 |

* cited by examiner

*Primary Examiner* — Hung V Ngo
(74) *Attorney, Agent, or Firm* — Armstrong Teasdale LLP

(57) ABSTRACT

An enclosure for an electrical circuit protection product such as a surge protection device include a three dimensional compatibility housing piece attachable to an enclosure assembly that visually provides informational feedback and enhanced state indication features for use by persons to more readily understand and locate compatible circuit protection devices and information.

13 Claims, 2 Drawing Sheets

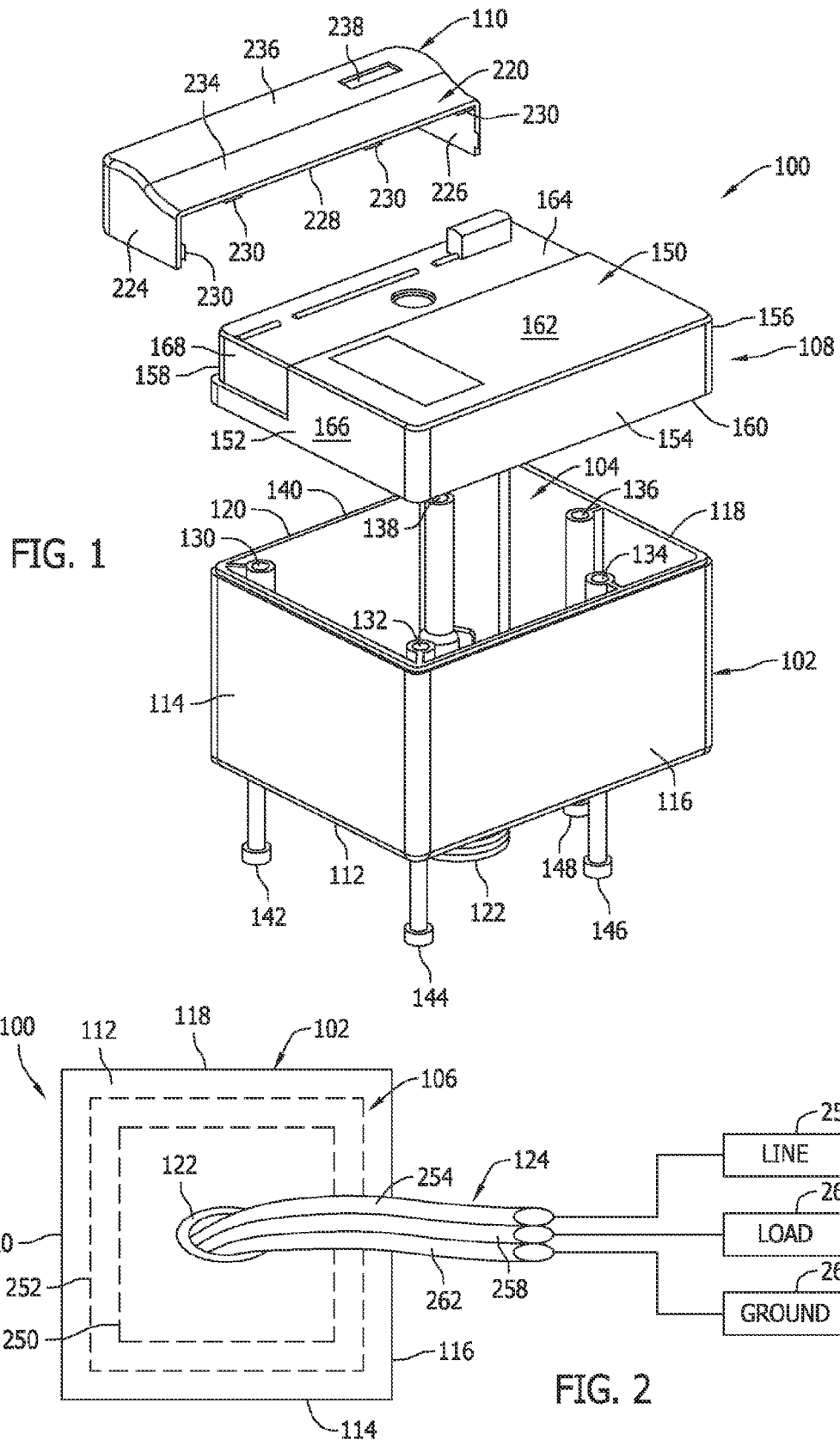

ELECTRICAL CIRCUIT PROTECTION DEVICE ENCLOSURE ASSEMBLY AND KIT WITH DEVICE COMPATIBILITY ATTACHMENT

BACKGROUND OF THE INVENTION

The field of the invention relates generally to electrical circuit protection devices, and more specifically to an enclosure assembly for electrical circuit protection devices.

A variety of electrical circuit protection devices are known for protecting electrical circuit from fault conditions or other voltage and current conditions that could damage load side electrical components and circuitry in an electrical power system. Such circuit protection devices include fuses, circuit breakers, current limiters, and surge protection devices to name a few.

In certain installations, circuit protection devices are installed in protective enclosures to prevent exposure to persons from hazard presented by energized electrical circuitry, and also to protect the circuit protection devices from environmental issues that could negatively affect operation of the devices, such as dust or other particles in the ambient environment and moisture. Such enclosures may be used indoors or outdoors and a variety of such enclosures exist and are in common use today. The National Electrical Manufacturers Association (NEMA) includes a host of specifications for such enclosures for particular uses and environmental conditions. Servicing circuit protection devices that are located in such enclosures can be problematic in some instances and improvements are desired.

BRIEF DESCRIPTION OF THE DRAWINGS

FIG. 1 is an exploded view of an exemplary disclosure assembly for an electrical circuit protection device.

FIG. 2 is a rear side view of the enclosure assembly shown in FIG. 1 with a circuit protection device.

DETAILED DESCRIPTION OF THE INVENTION

Figure 3:
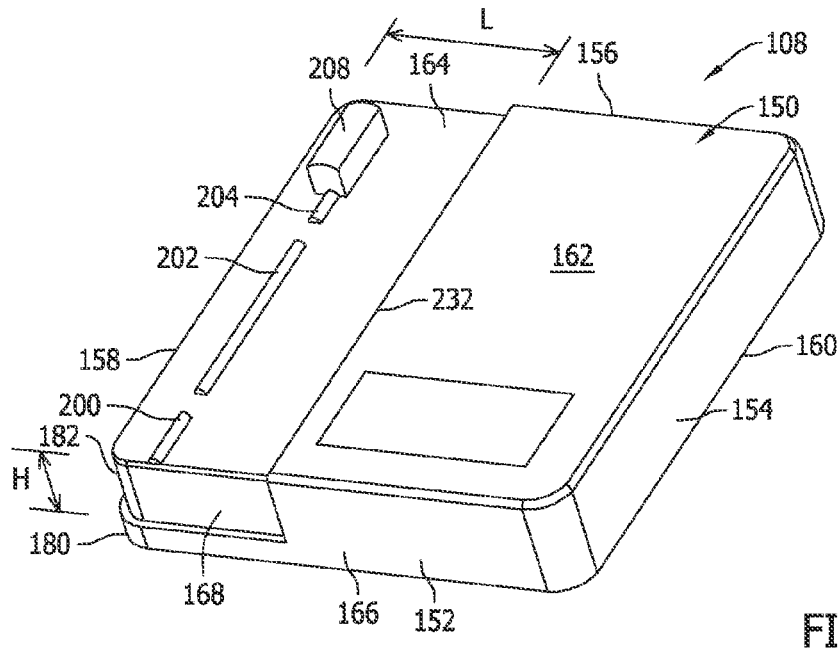
FIG. 3 is a perspective view of a lid enclosure housing piece for the enclosure assembly shown in FIG. 1.

Many types of electrical circuit protection devices, including but not necessarily limited to surge protection devices, are available at various ratings to protect circuitry at different operating voltages and that present varying levels of surge protection to the circuitry. Conventionally, enclosures for such devices across the various ratings of the surge protection devices are similar to one another. While the enclosures are typically marked with labels and the like including information, specifications, and ratings for compatible circuit protection devices in the enclosures, because of otherwise similar looking enclosures for circuit protection devices having different ratings, some potential for confusing differently rated devices in the enclosures remains. This can lead to problems when obtaining and servicing the enclosed circuit protection devices.

For example, when initially obtaining the circuit protection devices for installation, they may be purchased in the enclosure as a package in some instances. Again, because the enclosures tend to be quite similar in appearance, it is relatively easy for a purchaser to inadvertently purchase a package having a different rating than they intended. If such mistaken purchases go unnoticed, any installation of such devices in an electrical power system will result in a mismatch between how the purchaser or installer believes that the system is protected and how it is actually protected by the circuit protection device. A device of a higher rating than intended, or needed, may pass through voltages and currents that it should not, and result in damage to downstream electrical components and circuitry if certain electrical voltage or current events were to occur. A device of a lower rating than intended, or needed, may result in the device operating in instances when damage to downstream components is unlikely, and hence may undesirably interrupt electrical circuitry when there is no problematic circuit condition actually present. Neither of these two scenarios are desirable, From a service perspective, some types of surge protection devices may require replacement after they operate in response to predetermined electrical current or voltage events. That is, the enclosure may be opened and a replacement circuit protection device may be installed in the same enclosure. Preferably, the replacement circuit protection device should have the same rating as the operated circuit protection device. Because the rating of the circuit suppression device is not always easy to quickly determine, however, determining the rating of an operated circuit protection device and locating a proper replacement device is sometimes difficult.

While enclosures for electrical devices are often marked with information labels and the like, there are various reasons why such a label or marking may not be easily read when needed, or even be readable at all. Such reasons include poor lighting conditions, obstructions in the line of sight to the labels or marking of the enclosures when installed, the presence of dust or dirt that has built up over the labels or marking over a long period of time, or possible scratching, marring or weathering of the surfaces of the label or other marking. If the marking on the enclosure is not clearly readable, one must open the enclosure, disconnect the circuit protector device inside, and inspect the circuit protection device, which may be provided with its own label or marking, in order to determine its rating. Once the rating of the circuit protector device is determined, a replacement device of the same rating can be obtained. This can be inefficient in some instances when the rating of the device in the enclosure may not be what the maintenance person expected, and a replacement circuit protector of that rating is not on hand. Undesirable delays in adequately restoring or protecting the circuitry may result.

Attentive purchasers, installers, and maintenance personnel for electrical power systems should be able to avoid these issues with careful and thoughtful record keeping of circuit protection device information and proactively managing an adequate replacement inventory of circuit protection devices. In some instances, work procedures and safeguards may even be put in place to avoid to such mistakes. Experience shows, however, that human error is practically unpredictable and largely unavoidable across a large number of persons and across a large number of electrical power systems in use. Especially in large and complex electrical power systems, the number of different types of circuit protection devices in various locations only increases the potential for confusion and mistake. Even highly trained and experienced persons can inadvertently introduce an incompatible circuit device of the wrong rating at any given point in an electrical power system. Once this happens, the incompatible circuit protection devices can be very difficult to detect or correct. Suboptimal protection of the circuitry, and even suboptimal operation of an electrical power system, may accordingly exist indefinitely.

Also, and perhaps especially, a good deal of home improvement and business improvement projects, as well as home and business maintenance projects, are undertaken by the property owners or occupiers who often are not non-professional installers and/or who are non-professional service people. Such projects are often referred to as do-it-yourself projects. The lack of experience and training in installing and maintaining electrical surge protection devices and other circuit protection devices by do-it-yourselfers presents a heightened risk of confusion and mistake in selecting, replacing an coordinating circuit protection devices. Considering the proliferation of sensitive electronic devices protected by such circuit protection devices, the consequences of inadequately protected devices can be significant.

Improvements are desired in providing compatibility information so that ratings of circuit protection devices such as surge protection devices that are located in enclosures can more quickly and more accurately be determined Instances of incompatible circuit protection devices being inadvertently introduced to electrical power systems can be reduced, if not entirely avoided or eliminated by providing more intuitive and distinguishable compatibility information. Improvement is needed in determining ratings of circuit protection devices in less time and with less effort are desired for circuit protection devices such as surge protection devices that are located in enclosures so that proper replacement circuit protection devices may be more efficiently located.

Exemplary embodiments of an enclosure for an electrical circuit protection product such as a surge protection device are described herein that overcome these and other problems. This is achieved in part with a three dimensional compatibility housing piece attachable to an enclosure assembly that visually provides informational feedback and enhanced state indication features for use by persons to more readily understand and locate compatible circuit protection devices and information. Method aspects will be in part apparent and in part specifically discussed in the description below.

Referring now to the figures, an enclosure assembly for a circuit protection device is shown in FIG. 1 including a base enclosure housing piece 102 defining an open sided receptacle 104 for receiving a circuit protection device 106 (shown in phantom in FIG. 2), a lid enclosure housing piece 108 assembled to the base enclosure piece 102 and completing the open sided receptacle 104, and a three dimensional compatibility housing piece 110, separately provided from and attachable to the lid enclosure piece 108 in the exemplary embodiment shown. The three dimensional compatibility housing piece 110 visually indicates an attribute of the circuit protection device 106, such as one or more of its electrical ratings, as well as state detection features for the circuit protection device, so that one can see and understand from visual inspection of the assembly 100 key information regarding the circuit protection device within the enclosure.

The base enclosure housing piece 102 in the example shown includes a rear wall 112 and a plurality of side walls 114, 116, 118 and 120 extending perpendicularly from the rear wall 112. The side walls 114, 116, 118 and 120 are generally orthogonal with respect to one another, and in combination with the rear wall 112 define a generally rectangular, box-like receptacle 104 that is open at a side opposite the rear wall 112. The receptacle 104 may be configured with mounting features for locating the surge suppression device 106 (FIG. 2) at a fixed location therein.

The base enclosure housing piece 102 further includes a wiring conduit 122 located in, for example, the rear wall 112 as shown in FIGS. 1 and 2 so that connecting wires, generally shown at 124 in FIG. 2 of the surge suppression device 106 can be routed from an external location (i.e., outside of the base enclosure housing piece 102) to an internal location (i.e., inside of the base enclosure housing piece 102 in the receptacle 104) to connect electrical circuitry and the circuit protection device 106. In another embodiment, the wiring conduit 122 may alternatively be provided in one of the side walls 114, 116, 118 and 120 of the base enclosure housing piece 102 if desired. Also, more than one wiring conduit could be provided in the base enclosure housing piece 102.

It is also understood that in some embodiments, the wiring conduit 122 could be considered optional and may be omitted. In such embodiments, terminal structure may be provided in the enclosure assembly 100 for making electrical connections to line side and load side electrical circuitry.

In the exemplary embodiment shown, the side walls 114, 116, 118 and 120 of the base enclosure housing piece 102 are respectively formed with enclosed passages 130, 132, 134, 136 and 138 extending from the rear wall 112 toward the upper edge 140 of the base enclosure housing piece 102 opposite the rear wall 112. The base enclosure housing piece 102 may be formed using known materials, including but not limited to polycarbonate or heavy duty plastic materials, and known techniques such as molding techniques.

The lid enclosure housing piece 108 may be seated on the upper edge 140, and fasteners 142, 144, 146, 148 extend through the respective passages and 130, 132, 134, 136 and 138 and securely couple the lid enclosure housing piece 108 to the base enclosure housing piece 102. The fasteners 142, 144, 146, 148 may be screw fasteners having threaded ends that engage threaded couplers of the lid enclosure housing piece 108. The base enclosure housing piece 102 and the lid enclosure housing piece 108 collectively surround and enclose the circuit protection device 106. Sealing gaskets and other sealing features may be provided to effect a watertight or moisture proof enclosure for the circuit protection device 106 when the lid enclosure housing piece 108 is attached to the base enclosure housing piece 102. In one embodiment, the base enclosure housing piece 102 and the lid enclosure housing piece 108 define a NEMA 4x enclosure, although this is not necessary in all embodiments. The base enclosure housing piece 102 and the lid enclosure housing piece 108 may define enclosures satisfying other standards of NEMA, standards of other groups, or non-standardized manufacturer or end-user specifications.

The lid enclosure housing piece 108 in the example shown includes a top wall 150 and a plurality of side walls 152, 154, 156 and 158 extending perpendicularly from the top wall 150. The side walls 152, 154, 156 and 158 are generally orthogonal with respect to one another, and in combination with the top wall 150 define a generally rectangular, box-like receptacle 104 that is open at a lower edge 160 facing the base enclosure housing piece 102.

Figure 4:
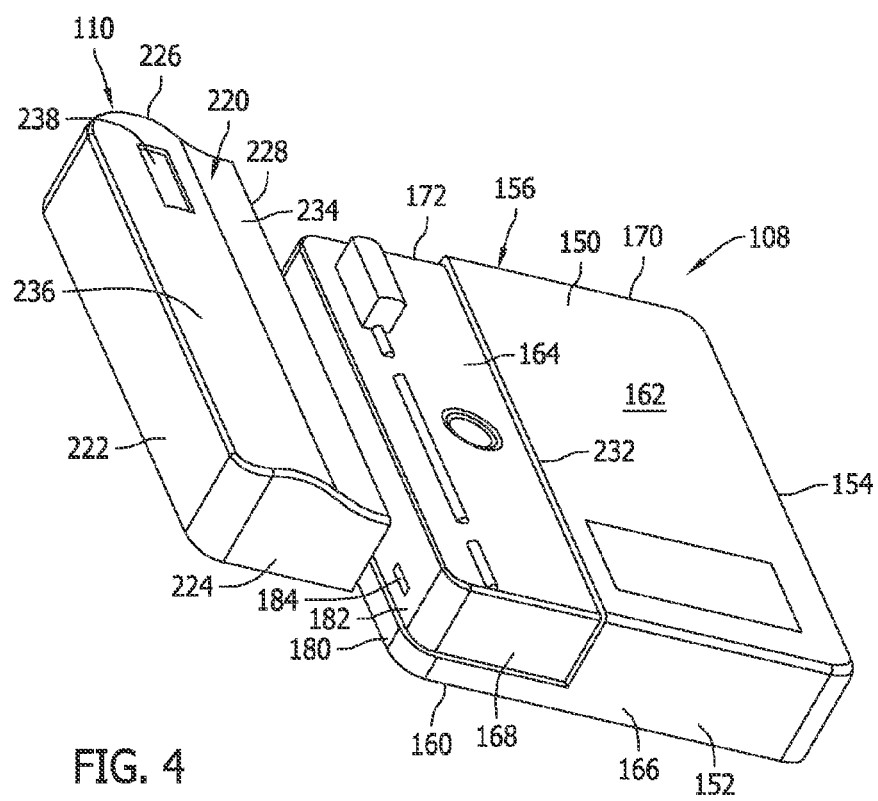
FIG. 4 is an exploded view of a lid enclosure housing piece and a compatibility housing piece subassembly.

The lid enclosure housing piece 108 is configured for surface engagement with the compatibility housing piece 110, either before or after the lid enclosure housing piece 108 is assembled to the base housing enclosure piece 102. As shown in FIGS. 1, 3, and 4, the top wall 150 includes a first planar surface 162 and a second planar surface 164 that is recessed from the first planar surface 162. That is, the second planar surface 164 extends generally planar to, but is offset from, the first planar surface 162 such that the second planar surface 164 extends at lower elevation while the first planar surface 162 extends at a higher elevation. In the example shown, the second, recessed surface 164 extends adjacent and from the side wall 158 and has a generally constant length dimension L (FIG. 3) that is less than the corresponding length of the side walls 156 and 152. The recessed surface 164 also extends the entire length of the side wall 158 in the exemplary embodiment shown. The recessed surface 164 extends only on a portion of the top side 150, with the relatively larger first surface 162 occupying the remainder of the top wall 150.

As shown in FIGS. 1, 3, and 4, the side wall 152 includes a first planar surface 166 and a second planar surface 168 that is recessed from the first planar surface 166. That is, the second planar surface 168 extends generally planar to, but is offset from, the first planar surface 166 such that the second planar surface 168 extends at lower elevation while the first planar surface 166 extends at a higher elevation. The second recessed surface 168 extends from the side wall 158 and along the length L (FIG. 3) that is less than the length of the sidewall 152, but has a height H that is less than the height of the side wall 152. As such, the recessed surface 168 on the side wall 152 meets the recessed surface 164 on the top wall 150, but does not extend to the bottom edge 160 of the lid enclosure housing piece 108.

The side wall 156 of the base enclosure housing piece 108, as best shown in FIG. 4, likewise includes a first planar surface 170 and a second planar surface 172 that is recessed from the first planar surface 170. The side walls 152 and 156 and their respective recessed surfaces are substantially identical in the exemplary embodiment depicted.

The side wall 158 of the base enclosure housing piece 108, as best shown in FIG. 4, likewise includes a first planar surface 180 and a second planar surface 182 that is recessed from the first planar surface 180. That is, the second planar surface 182 extends generally planar to, but is offset from, the first planar surface 180 such that the second planar surface 182 extends at lower elevation while the first planar surface 180 extends at a higher elevation on the side wall 158. The second recessed surface 182 extends adjacent the top wall 150 and extends along the entire length of the sidewall 152, but has a height H (FIG. 3) that is less than the height of the side wall 158. As such, the recessed surface 182 on the side wall 158 meets the recessed surface 164 on the top wall 150, but does not extend to the bottom edge 160 of the lid enclosure housing piece 108. A series of snap retention elements 184 may be formed on or in the recessed surface 182 and engage complementary features formed in the three dimensional compatibility housing piece 110. In one example, three snap retention elements 184 are provided, although greater or lesser numbers of snap retention elements may be utilized in other embodiments.

As also shown in the example depicted, the lid enclosure housing piece 108 includes projecting ribs 200, 204, 206 extending upwardly from the recessed surface 164 on the top side wall 150. The ribs 200 facilitate mechanical retention of the three dimensional compatibility housing piece 110 with complementary features formed therewith.

Also, in the example depicted, a light pipe 208 is formed in the top wall 150 and projects upwardly from the recessed surface 164. The light pipe 208 is designed to transmit light emitted from a state indicator of the circuit protection device 106 (FIG. 2) from a location internal to the assembled base enclosure housing piece 102 and lid enclosure housing piece 108, to another location on the surface of the lid enclosure housing piece 108 at a particular location. Thus, the same light emitted by the state indicator of the circuit protection device 106 may be seen at the location where the light pipe 208 ends of the top side 150 of the lid enclosure housing piece 108. The light pipe 208 may be considered optional in some embodiments, however, and need not be included.

The compatibility housing piece 110 in an exemplary embodiment as shown in FIGS. 1 and 4 includes a top wall 220, a front wall 222, and two side walls 224, 226 opposing one another. The front wall 222 and the side walls 224, 226 depend downwardly from the top wall 250 and, when assembled to the lid enclosure housing piece 108, the front wall 222 and the side walls 224, 226 generally overlie the respective recessed surfaces 164, 168, 182. The front wall 222 and the side walls 224, 226 further define an interface edge 228 including snap fit elements 230 that engage complementary features provided in a mating edge 232 of the lid enclosure housing piece 108. The interface edge 228 in the embodiment shown defines an elongated open channel that may receive the recessed end of the lid enclosure housing piece 108 as shown in FIG. 4. Unlike the lid enclosure housing piece 108, the compatibility housing piece 110 does not form a box-like enclosure. The compatibility housing piece 110 has five sides, rather than six, as shown in the exemplary embodiments illustrated.

The top wall 220 of the compatibility housing piece 110 includes a first curved section 234 and a second curved section 236 that is outwardly flared from the first curved section 234. The curved section 236 provides a rounded convex curvature to the top wall 220 that smoothly projects upwardly from the first curved section 234 that generally has a rounded concave curvature. Because of the curved sections 234 and 236, the side walls 224, 226 and the top wall 220 of the compatibility housing piece 110 each have a varying height at locations between the interface edge 228 and the front wall 222 of the compatibility housing piece 110. Specifically, the side walls 224, 226 in the depicted example have a height that is equal to the height H of the recessed surfaces 168, 172 (FIGS. 3 and 4) of the lid enclosure housing piece 108 near the interface edge 128. Also in the example shown the height of the side walls 224, 226 generally increases at a non-uniform rate from the interface edge 228 to a maximum height in the convex curvature of the top wall section 236, and thereafter the height starts to decrease as the top wall section 236 approaches the front wall 222. This imparts a distinctive wavy profile to the enclosure assembly 100 when the compatibility housing piece 110 is attached. The increasing height of the side walls 224, 226 provides additional clearance to accommodate the ribs 200, 202, 204 in the lid enclosure housing piece 108 that help retain the compatibility housing piece 110 when installed.

The curved section 236 of the top wall 220 further includes an opening or window 238 that receives the light pipe 208 formed in the lid enclosure housing piece 108. The window may alternatively be formed in another of the walls of the compatibility housing piece 110 if desired. In embodiments wherein the light pipe 208 is not included, the window 220 may be considered optional and need not be included. In embodiments including the light pipe 208, the raised height of the curved section 236 provides additional clearance to accommodate the light pipe 208 as the compatibility housing piece 110 is installed.

The compatibility housing piece 110 may be fabricated from polycarbonate or may be formed using known materials, including but not limited to polycarbonate or heavy duty plastic materials, and known techniques such as molding techniques.

When the compatibility housing piece 110 is assembled to the lid enclosure housing piece 108, the interface edge 228 is mated with the edge 232 of the lid enclosure housing piece, the light pipe 208 is extended through the window 238 and the various snap-fit elements 182, 230 provided and the ribs 200, 202, 204 (FIG. 2) provide secure snap-fit attachment of the compatibility housing piece 110 at numerous locations. When so attached, the curved top wall 220 of the compatibility housing piece 110 extends adjacent and projects upwardly from the flat and planar surface 162 of the lid enclosure housing piece, the side wall 224 extends in the recessed surface 168 in the lid enclosure housing piece side wall 152, the side wall 226 extends in the recessed surface 172 of the lid enclosure housing piece side wall 156, and the front wall 222 extends in the recessed surface 182 in the lid enclosure housing piece side wall 158. Where the walls of the compatibility housing piece 110 meet the non-recessed surfaces 166, 170 and 180 (FIG. 4) in the base enclosure housing piece 110, they are generally flush with one another. The compatibility housing piece 110, that occupies the recessed surfaces on the lid enclosure housing piece 108, only partially covers the lid enclosure housing piece 108 as shown.

The compatibility housing piece 110 provides a number of benefits and in large part solves the aforementioned problems in the art. The compatibility housing piece provides a visually distinctive shape that departs from the shape of the lid enclosure housing piece 108 and as such provides a strong visual cue for persons to reference. In contemplated embodiments, the three dimensional compatibility housing piece 110 is also color-coded to indicate an electrical rating of the circuit protection device 106 in the housing 102. That is, the compatibility housing piece 110 has a different color than the lid enclosure housing piece 108, and the color of the compatibility housing piece 110 corresponds with predetermined compatibility characteristics of a replacement circuit protector device that matches the device 106 inside the enclosure assembly 100. Especially when used with color-coded circuit protection devices wherein the different colors provided designate different electrical ratings of the circuit protection devices, the color-coded compatibility housing piece 110 visually and almost effortless conveys the necessary information regarding the enclosed circuit protection device and reduces a chance of an incompatible circuit protection device being replaced in the enclosure assembly 100. For example, if the compatibility housing piece 110 is red, a person may locate a circuit protection device that is also red, because red in this example indicates a compatible device of the same rating. Using such color-coding techniques, compatible devices may be obtained, even by persons who do not actually know the electrical ratings that correspond to any of the available colors in the color-coding utilized.

The compatibility housing piece 110 is three dimensional and is specifically contrasted with essentially one dimensional printed labels and marking plates that are conventionally used on existing circuit protection device enclosures. The three dimensional compatibility housing piece 110 is therefore not only visually prominent when installed to the enclosure assembly 100, but unlike printed labels and substantially one dimensional or planar markings, the compatibility housing piece 110 is less likely to wear, be covered with dust, or otherwise compromised after long periods of use. Some or all of the compatibility housing piece 110 is likely to be visible and easily recognizable to a person interested in ascertaining the rating of the circuit protector in the enclosure assembly 100 and/or obtaining a compatible replacement circuit protector device. Moreover, and in color-coded embodiments contemplated, the compatibility housing piece 110 need not be closely inspected, and the difficulties of reading printed labels and one dimensional markings to obtain, and then remember or record the necessary compatibility information, such as electrical rating information for the device, are avoided.

When the circuit protector device 106 includes a local state indicator that illuminates to indicate the state of the circuit protector and to identify circuit protectors that need replacement, the light pipe 208 and the curved top wall 220 of the compatibility housing piece 110 provide a prominent location for the indication to be seen. In comparison to conventional illuminated indicators that are flush mounted on a surface of the enclosure, the light pipe 208 projecting the curved top wall 220 provides a more noticeable and distinctive form of state indication than has conventionally been provided.

From a manufacturer's perspective, the base enclosure housing piece 102 and the lid enclosure housing piece 108 can be provided as standardized parts, while the compatibility housing pieces 110 can be separately provided and installed to provide differentiated compatibility information corresponding to the circuit protector device 106 enclosed in the housing. As such, substantially the same base enclosure housing pieces 102 and the lid enclosure housing pieces 108 can be used across the full line of circuit protector devices having various ratings, with the appropriate one of the compatibility housing pieces 110 being installed to complete the disclosure assembly 100 but differentiating the differently rated devices from one another.

In contemplated embodiments, the base enclosure housing pieces 102, the lid enclosure housing pieces 108, and the compatibility housing pieces may be made available as kits for assembly at the manufacturer level, the distribution level, or the end user level. For example, a kit including a plurality of compatibility housing pieces 110 may be provided, each separately provided from and interchangeably attachable to the lid enclosure housing piece 110, and each of the plurality of the compatibility housing pieces 110 visually indicating a different one of a plurality of different attributes of the circuit protection device, including but not limited to an electrical rating of the circuit protector device. As mentioned above, the compatibility housing pieces 110 may be differentiated by color according to a color-coding system. Additionally, the shape of the compatibility housing piece 110 s 110 may further be varied to provide additional differentiation, the compatibility housing pieces 110 may be provided with and without windows, and other variations of the compatibility housing pieces 110 may be provided in kit form.

The compatibility housing piece 110 may be provided at relatively low cost in comparison to providing distinct lid enclosure housing pieces 108 that provide differentiation of the circuit protector device ratings. The same lid pieces 110 may be used with differently rated circuit protection devices, with the compatibility housing piece 110 providing visual feedback to interested persons regarding the actual rating(s) of the circuit protector device 106.

The compatibility housing piece 110 may also quickly be installed by hand and without the use of tools to quickly and easily provide a desired differentiation of enclosure assemblies for use with circuit protector devices having different ratings.

In contemplated embodiments, and as shown in FIG. 2, the circuit protection device 106 in the enclosure assembly 100 is a surge protection device. As generally known in the art, electrical power systems are subject to voltages within a fairly narrow range under normal operating conditions. However, power system disturbances, such as lightning strikes and switching surges, may produce momentary or extended voltage levels that exceed the levels experienced by the circuitry during normal operating conditions. These voltage variations often are referred to as over-voltage conditions. As such, the surge suppression device 106 is provided to protect circuitry against such over-voltage conditions.

The surge suppression device 106 accordingly includes one or more voltage-dependent, nonlinear resistive elements 250, referred to as varistors, which may be, for example, metal oxide varistors (MOV's). A varistor is characterized by having a relatively high resistance when exposed to a normal operating voltage, and a much lower resistance when exposed to a larger voltage, such as is associated with over-voltage conditions. The impedance of the current path through the varistor 250 is substantially lower than the impedance of the circuitry being protected when the device is operating in the low-impedance mode, and is otherwise substantially higher than the impedance of the protected circuitry. As over-voltage conditions arise, the varistors 250 switch from the high impedance mode to the low impedance mode and shunt or divert over-voltage-induced current surges away from the protected circuitry and to electrical ground, and as over-voltage conditions subside, the varistors may return to a high impedance mode. The varistor(s) provided may be configured to provide different voltage ratings, current ratings, impedance ratings, and the like as those in the art will no doubt appreciate.

The surge suppression device 106 may include its own housing 252 enclosing the varistor(s) 250. The housing 252 may be provided with mounting features to facilitate its installation with the base enclosure housing piece 102 and secure the surge suppression device 106 therein. The connecting wires 124 in the example shown may include a first wire 254 connecting the varistor 250 and line side circuitry 256, a second wire 258 connecting the varistor 250 and the load side circuitry 260, and a third wire connecting the varistor 250 to electrical ground 264. The line, load and ground connections may be established using known connectors and techniques.

As previously discussed, the surge suppression device 106 may include a light emitting state indication feature, and as one example, the light emitting state indicator feature may illuminate to indicate an overvoltage event. The illumination may indicate that the device 106 needs to be replaced as it is no longer capable of completing the circuit between the line and load side circuitry. Surge suppression devices may be provided in modular housings, and hence may be removed from and replaced in the enclosure assembly 100.

As another example, the surge suppression device 106 may include a mechanical state indicator that in normal operation is not visible, but once the surge protection device has operated becomes visible at an exterior location of the device housing 252. For example a spring loaded indicator tab may be released and may be extended through the device housing 252 to indicate that an overvoltage event has occurred. In such a case, the compatibility housing piece 110 may be made from a transparent material such that the indicator tab can be seen once the surge protection device 106 operates.

While exemplary types of circuit protector devices 106 have been described, it is recognized that other types of circuit protection devices may likewise benefit from the enclosure assembly 100, and as such the invention is not necessarily limited to use with surge protection devices. Accordingly, other types of circuit protection devices present similar issues and likewise may be utilized in other embodiments.

Various adaptations of the concepts described above are possible while still achieving the benefits and advantages of the exemplary embodiments described. For example, while the compatibility housing piece 110 described is configured for snap-fit retention with the lid enclosure housing piece 108, it may alternatively be attached with separately provided fasteners such as screws, or as another example may be adhered to the lid enclosure housing piece. Also, the connecting wires 124 described may be omitted if other terminal structure is provided to connect the circuit protector device to electrical circuitry of an electrical power system.

The benefits and advantages of the inventive concepts disclosed are now believed to be apparent in view of the exemplary embodiments disclosed.

An embodiment of an enclosure assembly for a circuit protection device has been disclosed including: a base enclosure housing piece defining an open sided receptacle for receiving the circuit protection device; a lid enclosure housing piece assembled to the base enclosure piece and completing the open sided receptacle, the base and the lid collectively enclosing the circuit protection device; and a three dimensional compatibility housing piece, separately provided from and attachable to the lid enclosure piece, the three dimensional compatibility housing piece visually indicating an attribute of the circuit protection device.

Optionally, the three dimensional compatibility housing piece may be color coded to indicate an electrical rating of the circuit protection device. The three dimensional compatibility housing piece may consist of a top wall, a front wall, and two side walls. The three dimensional compatibility housing piece may further include a window in at least one of the top wall, front wall and side walls. The lid enclosure housing piece may include a light pipe, the light pipe extending through the window. The lid enclosure housing piece may include a flat top wall, and the three dimensional compatibility housing piece may include a curved top wall overlying the flat top wall. The lid enclosure housing piece may also include a side wall having a constant height dimension, and the three dimensional compatibility housing piece includes a side wall having a variable height dimension, the side wall of the three dimensional compatibility piece overlying the flat side wall of the lid.

The three dimensional compatibility housing piece may cover only a portion of the lid enclosure piece, and may be configured to be snap-fit with the lid enclosure housing piece. The base enclosure housing piece may define a rear wall and a plurality of side walls extending upwardly from the rear wall. The base enclosure housing piece may further include a wiring conduit located in one of the rear wall and the side walls. The wiring conduit may extend through the rear wall. The at least one of the side walls may include at least one enclosed passage extending upwardly from the rear wall toward the lid. The enclosure may also include a fastener extending through the at least one passage and coupling the lid enclosure housing piece to the base enclosure housing piece.

An embodiment of a kit for assembling an enclosure assembly for a circuit protection device, the kit including: a lid enclosure housing piece; and a plurality of three dimensional compatibility housing pieces, each separately provided from and interchangeably attachable to the lid enclosure housing piece, and each of the plurality of the three dimensional compatibility housing pieces visually indicating one of a plurality of different attributes of the circuit protection device.

Optionally, each of the plurality of the three dimensional compatibility housing pieces in the kit may be color coded to indicate an electrical rating of the circuit protection device. The three dimensional compatibility housing piece may consists of a top wall, a front wall, and two side walls. The three dimensional compatibility housing piece may further include a window in at least one of the top wall, front wall and side walls. The lid enclosure housing piece may include a light pipe, with the light pipe extending through the window. The lid enclosure housing piece may include a flat top wall, and the three dimensional indication housing piece may include a curved top wall overlying the flat top wall. The lid enclosure housing piece may include a flat side wall having a constant height dimension, and the three dimensional compatibility housing piece may include a side wall having a variable height dimension, with the side wall of the three dimensional indication piece overlying the flat side wall of the lid when assembled thereto. The three dimensional compatibility housing piece may cover only a portion of the lid enclosure piece. The three dimensional compatibility housing piece may be configured to be snap-fit with the lid enclosure housing piece.

A base enclosure housing piece in the kit may define an open sided receptacle for receiving the circuit protection device. The base enclosure housing piece may define a rear wall and a plurality of side walls extending upwardly from the rear wall. The base enclosure housing piece may also include a wiring conduit located in one of the rear wall and the side walls. The wiring conduit may be located in the rear wall. At least one of the side walls may include an enclosed passage extending upwardly from the rear wall toward the lid enclosure housing piece. The kit may also include a fastener extending through the passage and coupling the lid enclosure housing piece to the base enclosure housing piece.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An enclosure assembly for a circuit protection device comprising:
    a base enclosure housing piece defining an open sided receptacle for receiving the circuit protection device, wherein the base enclosure housing piece claims a rear wall and four side walls extending upwardly from the rear wall;
    a lid enclosure housing piece comprising a top wall and four side walls expending perpendicularly from the top wall, the lid enclosure housing piece completing the open sided receptacle when assembled to the base enclosure housing piece with the base enclosure housing piece and the lid enclosure housing piece collectively enclosing the circuit protection device; and
    a three dimensional compatibility housing piece, separately provided from and attachable to the lid enclosure housing piece, the three dimensional compatibility housing piece including a top wall and opposing side walls depending from the top wall, the top wall and opposing side walls of the lid enclosure housing piece overlying the top wall and first and second ones of the four side walls of the lid enclosure housing piece and visually indicating an attribute of the circuit protection device.

2. The enclosure assembly of claim 1, wherein the three dimensional compatibility housing piece is color coded to indicate an electrical rating of the circuit protection device.

3. The enclosure assembly of claim 1, wherein the top wall of the lid enclosure housing piece is flat, and wherein the top wall of the three dimensional compatibility housing piece is curved, the curved top wall of the three dimensional compatibility housing piece overlying the flat top wall of the lid enclosure piece when the three dimensional compatibility housing piece is assembled to the lid enclosure housing piece.

4. The enclosure assembly of claim 1, wherein the three dimensional compatibility housing piece covers only a portion of the lid enclosure housing piece when the three dimensional compatibility housing piece is assembled to the lid enclosure housing piece.

5. The enclosure assembly of claim 1, wherein the three dimensional compatibility housing piece is configured to be snap-fit with the lid enclosure housing piece.

6. The enclosure assembly of claim 1, wherein the base enclosure housing piece further comprises a wiring conduit located in one of the rear wall and the four side walls.

7. The enclosure assembly of claim 6, wherein the wiring conduit extends through the rear wall.

8. The enclosure assembly of claim 1, wherein at least one of the four side walls of the base enclosure housing piece includes at least one enclosed passage extending upwardly from the rear wall toward the lid enclosure housing piece.

9. The enclosure of claim 8, further comprising a fastener extending through the at least one enclosed passage and coupling the lid enclosure housing piece to the base enclosure housing piece.

10. An enclosure assembly for a circuit protection device comprising:
    a base enclosure housing piece defining an open sided receptacle for receiving the circuit protection device;
    a lid enclosure housing piece assembled to the base enclosure housing piece and completing the open sided receptacle, the base enclosure housing piece and the lid enclosure housing piece collectively enclosing the circuit protection device; and
    a three dimensional compatibility housing piece, separately provided from and attachable to the lid enclosure housing piece, the three dimensional compatibility housing piece visually indicating an attribute of the circuit protection device;
    wherein the three dimensional compatibility housing piece consists of a top wall, a front wall, and two side walls.

11. The enclosure assembly of claim 10, wherein the three dimensional compatibility housing piece further includes a window in at least one of the top wall, front wall and the two side walls.

12. The enclosure assembly of claim 11, wherein the lid enclosure housing piece includes a light pipe, the light pipe extending through the window.

13. An enclosure assembly for a circuit protection device comprising:
    a base enclosure housing piece defining an open sided receptacle for receiving the circuit protection device;
    a lid enclosure housing piece assembled to the base enclosure housing piece and completing the open sided receptacle, the base enclosure housing piece and the lid enclosure housing piece collectively enclosing the circuit protection device; and
    a three dimensional compatibility housing piece, separately provided from and attachable to the lid enclosure housing piece, the three dimensional compatibility housing piece visually indicating an attribute of the circuit protection device,
    wherein the lid enclosure housing piece includes a side wall having a constant height dimension, and the three dimensional compatibility housing piece includes a side wall having a variable height dimension, the side wall of the three dimensional compatibility piece overlying the flat side wall of the lid enclosure housing piece.

\* \* \* \* \*